(12) United States Patent
Roggendorf et al.

(10) Patent No.: US 11,475,183 B1
(45) Date of Patent: Oct. 18, 2022

(54) SIMULATION ENVIRONMENT WITH DYNAMIC OPTIMIZATION OF FIDELITY

(71) Applicant: Rockwell Collins, Inc., Cedar Rapids, IA (US)

(72) Inventors: Brian R. Roggendorf, Marion, IA (US); Benjamin J. Haan, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 602 days.

(21) Appl. No.: 16/524,786

(22) Filed: Jul. 29, 2019

(51) Int. Cl.
*G06F 30/00* (2020.01)
*G06F 30/20* (2020.01)
*G08G 5/00* (2006.01)

(52) U.S. Cl.
CPC ............ *G06F 30/20* (2020.01); *G08G 5/003* (2013.01)

(58) Field of Classification Search
CPC ................................ G06F 30/20; G08G 5/003
See application file for complete search history.

(56) References Cited

U.S. PATENT DOCUMENTS

| | | | | |
|---|---|---|---|---|
| 7,280,991 B1 * | 10/2007 | Beams | ...................... | G09B 7/04 706/46 |
| 7,558,719 B1 * | 7/2009 | Donlin | ..................... | G06F 30/20 716/106 |
| 8,996,342 B1 * | 3/2015 | Brennan | .................. | G06F 30/23 703/7 |
| 10,380,275 B2 * | 8/2019 | Van der Velden | ...... | G06F 30/20 |
| 10,489,526 B1 * | 11/2019 | Sattigeri | ................. | G06F 30/15 |
| 10,896,270 B2 * | 1/2021 | Abramson | .............. | G06F 30/20 |
| 2003/0084015 A1 * | 5/2003 | Beams | ...................... | G09B 5/14 706/46 |
| 2011/0288840 A1 * | 11/2011 | Kropinski | ............... | G06F 30/15 703/8 |
| 2012/0041747 A1 * | 2/2012 | Aarts | ...................... | G06F 30/20 703/14 |
| 2018/0060456 A1 * | 3/2018 | Phatak | .................... | G06F 30/15 |
| 2019/0303263 A1 * | 10/2019 | Fleming, Jr. | ........ | G06F 11/3024 |
| 2019/0370420 A1 * | 12/2019 | Feng | ....................... | G06F 30/20 |
| 2020/0175125 A1 * | 6/2020 | Erbe | ........................ | G06F 30/20 |
| 2020/0177712 A1 * | 6/2020 | Wildhagen | ............ | G06F 9/4881 |

* cited by examiner

*Primary Examiner* — Peter D Nolan
*Assistant Examiner* — Peter Y Ning
(74) *Attorney, Agent, or Firm* — Suiter Swantz pc llo

(57) ABSTRACT

A simulation environment is disclosed. A simulator generates a simulation model corresponding to a sequence of simulation cycles, each cycle including initial conditions, propagatable states, and a level of simulation fidelity. A fidelity optimizer monitors states and conditions through each cycle, changing the fidelity level for the next cycle based on predetermined factors (e.g., a new flight segment). The fidelity optimizer may dynamically increase or decrease the fidelity level for the next cycle (or for one or more nodes within a group) in response to, or in anticipation of, a state change. The fidelity optimizer may sample several corresponding simulation cycles of varying fidelity levels to compare the effects or results, and determine whether the result is dependent on the fidelity level.

12 Claims, 3 Drawing Sheets

SIMULATION ENVIRONMENT WITH DYNAMIC OPTIMIZATION OF FIDELITY

BACKGROUND

When optimizing a problem, a computer simulation may be constructed that allows the user to simulate a variety of initial conditions and response options to determine an optimal solution without expending real-world resources. If available computer resources are sufficient, a high-fidelity simulation may be used. If a sufficiently accurate result can be produced by a lower-fidelity simulation, the lower-fidelity simulation may be used instead. In some scenarios, however, the lower-fidelity simulation may suffice for a portion of the scenario, but at certain critical points a high-fidelity simulation may be required, e.g., conditions may change dramatically, interfering with an otherwise mundane or routine scenario in complex ways.

SUMMARY

A simulation environment is disclosed. In embodiments, the simulation environment includes simulators configured for generating a simulation model, e.g., a realistic interactive simulation of an aircraft in flight, including taxi, takeoff, and landing segments. The simulation model may comprise a sequence of cycles (e.g., takeoff, climb to cruising altitude, cruise, initial descent, periods of adverse weather), each cycle associated with its own set of initial conditions and states (which may propagate from one cycle to the next) and with a fidelity level of the simulation (e.g., a high level vs. a low level of precision, detail, or responsiveness to control input). The simulation environment includes a fidelity optimizer for monitoring the conditions and states as the simulation proceeds. The fidelity optimizer may change the fidelity level (e.g., increase or decrease the level of precision with which the simulation operates) either based on predetermined factors or dynamically, based on an identified model difference (e.g., a deviation in results between a high-fidelity and low-fidelity simulation).

A method for dynamic control of simulation fidelity is also disclosed. In embodiments, the method includes executing, via a simulator (e.g., simulation engine), a simulation model comprising a sequence of cycles, the simulation model associated with a set of conditions and states (which may propagate from one cycle to the next) and with a fidelity level (based on, e.g., the level of precision, detail, or responsiveness). The method includes changing, via a fidelity optimizer, the fidelity level of one or more cycles based on predetermined factors and monitoring the conditions and states as the simulation proceeds. The method includes dynamically changing the fidelity level for a given cycle based on the monitoring of states (e.g., in response to, or in anticipation of, a change in states suggesting an increase or decrease in fidelity.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
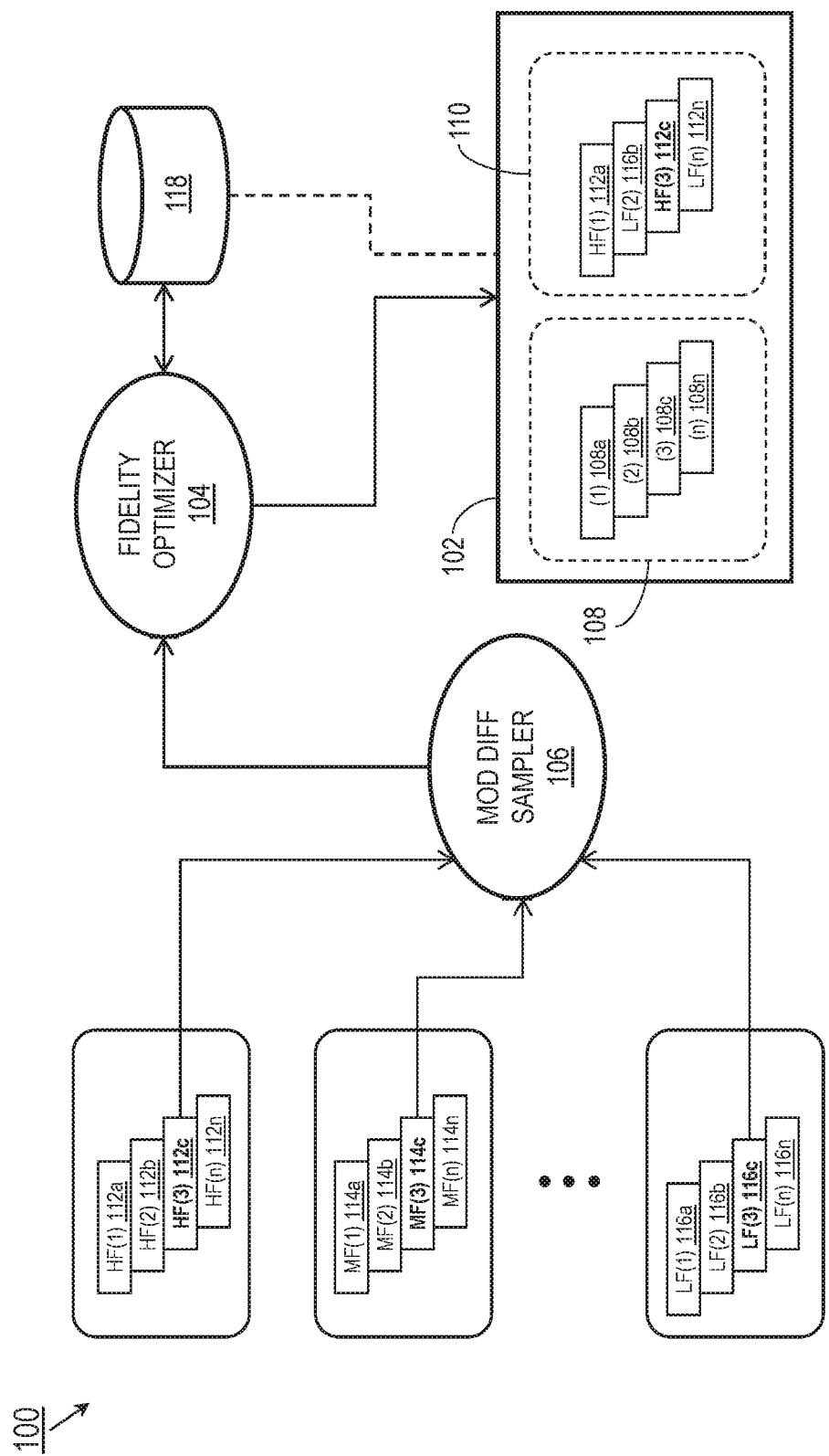
FIG. 1 is a block diagram illustrating a simulation environment in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a simulation environment capable of autonomously optimizing complex problems by creating simulation models of varying fidelity as needed or desired. Within a single simulation model, for example, some cycles may be simulated at a high level of precision, detail, or responsiveness, while more mundane cycles may be simulated with less precision to conserve processing resources.

Referring to FIG. 1, a simulation environment 100 is disclosed. In embodiments, the simulation environment 100 may include a main simulator 102, a fidelity optimizer 104, and a model difference sampler 106.

The main simulator 102 may include processors, graphics generators, and other computing resources capable of generating complex optimum simulation models 108 configured for multiple levels of simulation fidelity as needed. For example, the main simulator 102 may (e.g., via a centralized application executing on its processors) generate a simulation model (108) comprising a sequence of simulation cycles 108a, 108b, 108c, ... 108n (e.g., simulation segments), each individual cycle 108a-n corresponding to a subset of the simulation model 108 as a whole. Each simulation cycle 108a-n may be implemented as a subroutine using common state definitions and without static variables, such that initial conditions, configurations, and states may be propagated seamlessly from each simulation cycle to its succeeding simulation cycle. Based on this framework the main simulator 102, in conjunction with the fidelity optimizer 104 and the model difference sampler 106, may generate an optimum fidelity simulation model 110, wherein each simulation cycle 108a-n of the simulation model 108 is executed at the optimal fidelity level for that cycle. Conventionally, the simulation model 108, or any one of its cycles 108a-n, may be executable at any of m different levels of fidelity; for example, a high-fidelity simulation 112 may be comprised of high-fidelity simulation cycles 112a-n, a moderate-fidelity simulation 114 of moderate-fidelity simulation cycles 114a-n, and a low-fidelity simulation 116 of low-fidelity or minimal-fidelity simulation cycles 116a-n.

In embodiments, the fidelity optimizer 104 may select an optimal level of simulation fidelity for each cycle of the optimal fidelity simulation 110 output to the centralized application running on the main simulator 102. Selecting a fidelity level may be driven by predetermined factors; the simulation environment 100 may include a memory 118 or any other appropriate means of data storage capable of storing predetermined factors to be considered by the fidelity optimizer 104 with respect to particular simulation cycles 108a-n or groups of cycles comprising the optimal fidelity simulation model 110.

For example, the optimum fidelity simulation model 110 may simulate a complete transatlantic flight by a particular commercial aircraft of a particular size and having, e.g., particular configuration and handling characteristics. The fidelity optimizer 104 may select a high level of fidelity (e.g., 112a) for the optimal-fidelity simulation cycle corresponding to an early simulation cycle 108a, e.g., in order to provide a high level of detail and simulated system response during takeoff and initial climb cycles requiring multiple critical inputs. Similarly, the fidelity optimizer 104 may select a relatively low level of fidelity (e.g., 116b) for the optimal-fidelity simulation cycle corresponding to a later simulation cycle 108b, e.g., to reflect long, relatively uneventful stretches of level flight along transoceanic flight tracks at a safe cruising altitude.

The memory 118 may similarly store user-determined levels of interest in the fidelity level of a particular cycle of the optimal fidelity simulation 110. For example, an end user may wish to simulate a passenger experience rather than a command-crew experience, and thus have a higher level of interest in the accuracy of level-flight cycles associated with the simulation cycle 108b (e.g., to assess the medium-term to long-term comfort of aircraft interiors or seating facilities) than with the takeoff/climb cycles associated with the simulation cycle 108a; in this case the fidelity optimizer 104 may not select as high a fidelity level for the optimal-fidelity simulation cycle corresponding to the simulation cycle 108a or as low a fidelity level for the optimal-fidelity simulation cycle corresponding to the simulation cycle 108b. Accordingly, the fidelity optimizer 104 may not select a simulation cycle of higher fidelity for inclusion in the optimum simulation model 110 if the corresponding user interest level or priority level of the given cycle is low.

In embodiments, the fidelity optimizer 104 may dynamically select the fidelity level of a given cycle of the optimal fidelity simulation model 110. For example, the fidelity optimizer 104 may monitor conditions, states, and results associated with a running simulation cycle (e.g., corresponding to cycle 108b) and dynamically change the fidelity level of the next simulation cycle (e.g., corresponding to cycle 108c; from a low-fidelity simulation cycle 116b to a high-fidelity simulation cycle 116c). The fidelity optimizer 104 may dynamically change the fidelity level in response to a set of states, conditions, and/or results indicative of a need for a higher fidelity level. In the context of the transatlantic flight referenced above, a relatively uneventful level flight at cruising altitude (where the simulation results would vary to no more than a small degree depending on the simulation fidelity) may be interrupted by the presence of ash clouds associated with an unforeseen volcanic eruption, requiring a higher degree of precision to account for potential deterioration of visibility and/or performance due to the ash clouds.

Similarly, the fidelity optimizer 104 may dynamically change the fidelity level in anticipation of, rather than in response to, a change in states or conditions. Anticipation of a change in states or conditions may be driven by learned sensitivity developed through the execution of prior simulation models. For example, the fidelity optimizer 104 building an optimal fidelity simulation model 110 for transatlantic flights may observe over the course of prior simulation models (e.g., associated with transoceanic flights, overland flights, or flights generally) that a particular set of conditions, states, results, or effects (or changes thereto) are consistently associated with dynamic changes in fidelity level (e.g., a particular set of atmospheric conditions such as changes in windspeed, air temperature, barometric pressure, precipitation may consistently lead to adverse weather conditions and reduced visibility, which in turn may require heightened responsiveness from the command crew or increased turbulence for passengers). The fidelity optimizer 104 may store to memory (118) its observations, such that when similar conditions, states, results or effects are observed by the fidelity optimizer in the course of a particular simulation cycle, the fidelity level of the next simulation cycle may be increased in anticipation of adverse or more demanding atmospheric conditions (and correspondingly a more detailed or more responsive simulation environment 100). In some embodiments, the learned sensitivity of the fidelity optimizer 104 may be trained by machine learning or neural network learning techniques, e.g., by building a knowledge base of test scenarios from which patterns may be observed and from which conclusions may be drawn.

In some embodiments, the fidelity optimizer 104 may dynamically change the fidelity level for a particular cycle of the optimal fidelity simulation model 110 by sampling corresponding simulation cycles 112c, 114c, 116c of varying fidelity levels, each set of simulation cycles corresponding to a common set of initial conditions, states, and effects. By assessing any model differences between the results of corresponding simulation cycles 112c, 114c, 116c, the model difference sampler 106 may determine the sensitivity of the results of a given simulation cycle (e.g., whether or not the fidelity level affected the ultimate solution or result) to its fidelity level and select the simulation cycle of optimal fidelity (e.g., low-fidelity simulation cycle 116c) for inclusion in the optimal fidelity simulation model 110. Similarly, the fidelity optimizer 104 may use any determined model differences to tune or improve a given simulation model at one or more fidelity levels. For example, if the model difference sampler 106 observes a deviation in results between a high-fidelity simulation cycle 112c and a low-fidelity simulation cycle 116c, the point of deviation may be identified and the low-fidelity simulation cycle retuned, or retrained, to reduce or eliminate the deviation in results with respect to future simulation models 108.

In some embodiments, the simulation model 108 and the optimal fidelity simulation model 110 may reflect a non-real-time simulation wherein, for example, the high-fidelity simulation 112c of a given simulation cycle (108c) may take many times longer to execute than would a moderate-fidelity simulation 114c or low-fidelity simulation 116c. In such a scenario the fidelity optimizer 104 may "reverse time" and substitute the high-fidelity simulation 112c in the optimal fidelity simulation model 110 if needed or desired.

In some embodiments, the main simulator 102, fidelity optimizer 104, and model difference sampler 106 may each be embodied on different processors (e.g., physical processors or processing cores or virtual processors partitioned within a physical processing core or multi-core processing environments) or within different processing environments. Alternatively, one or more of the main simulator 102, fidelity optimizer 104, and model difference sampler 106 may be co-located within a single processing environment.

Figure 2:
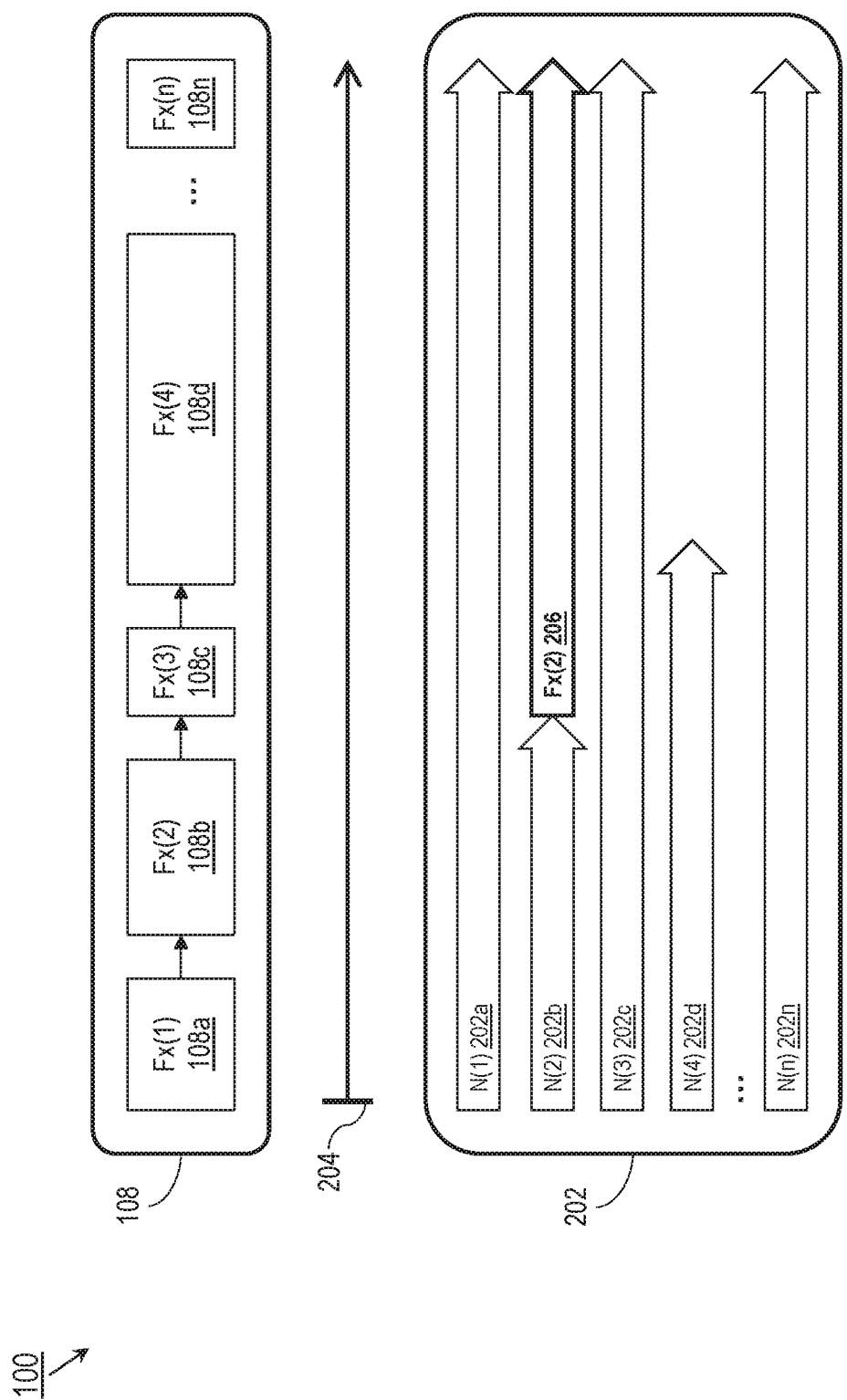
FIG. 2 is a diagrammatic illustration of simulations generated by the simulation environment of FIG. 1.

Referring to FIG. 2, the simulation models 108 and 202 are disclosed. In embodiments, the simulation model 108 may reflect a sequence of simulation cycles 108a, 108b, . . . 108n proceeding along a time axis 204, whereby each simulation cycle follows the previous cycle and the set of states and results from a given simulation cycle are propagated into the next simulation cycle (whether or not the fidelity level of two successive simulation cycles is consistent, see. e.g., the optimal fidelity simulation model 110, FIG. 1). In this way, the simulation model 108 may simulate not just the transatlantic flight discussed above, but other scenarios tracking a sequence or progression of events over time, e.g., chemical reactions, scene generation (e.g., wherein the fidelity level may vary according to available light or the time of day).

In some embodiments, the simulation model 202 may be implemented and may function similarly to the simulation model 108, except that the simulation model 202 to be optimized by the fidelity optimizer 104 may reflect a group of individual simulated nodes 202a, 202b, . . . 202n simultaneously running, whereby the fidelity level of each simulated node 202a-n may vary over time (e.g., time axis 204). For example, the simulation model 202 may correspond to communications monitoring (e.g., tracking radio frequency (RF) interference) whereby the capacity of numerous RF sources (corresponding to the individual simulated nodes 202a-n) for RF interference is tracked. If, for example, the signal strength of no individual RF source is sufficient to create a risk of interference, each simulated node 202a-n may continue to run at a low fidelity level. If, however, an RF source 202b gains sufficient strength or begins to interfere with the simulated signal, the fidelity optimizer 104 may increase the fidelity level of the RF source (206) while the interference or potential interference persists. Similarly, the simulation model 202 may be applied to scene-generating simulations, e.g., wherein foreground scene elements may correspond to higher-fidelity simulation nodes 202a-n and background, nonessential, obscured, or low-light elements may correspond to lower-fidelity simulation nodes.

Figure 3:
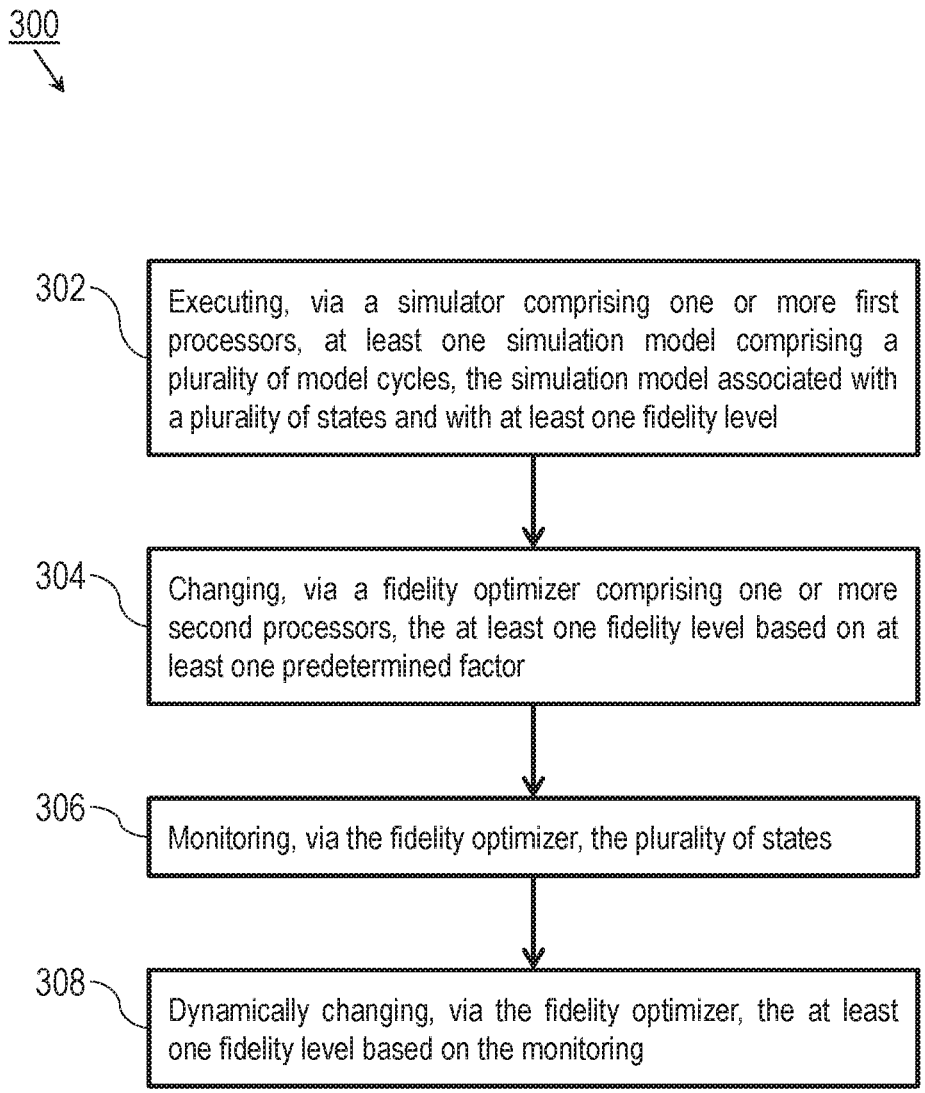
FIG. 3 is a flow diagram illustrating a method for dynamic control of simulation fidelity, in accordance with example embodiments of this disclosure.

Referring to FIG. 3, an exemplary embodiment of a method 300 for dynamic control of simulation fidelity may be implemented by the simulation environment 100 and may include the following steps.

At a step 302, the simulator executes a simulation model comprising a sequence, or group, of model cycles. The simulation model may include a plurality of states (e.g., propagated from each model cycle to the subsequent cycle) and one or more fidelity levels (e.g., high, moderate, low, minimal).

At a step 304, a fidelity optimizer changes one or more fidelity levels, (e.g., a fidelity level corresponding to a model cycle) based on predetermined factors.

At a step 306, the fidelity optimizer monitors the states of the simulation model.

At step 308, the fidelity optimizer dynamically changes one or more fidelity levels based on the state monitoring. For example, a model difference sampler may determine the effects or results of two or more simulation cycles, each cycle having a different fidelity level, to assess whether the fidelity level affected the result; the fidelity optimizer may increase or decrease the fidelity level based on this assessment. In some embodiments, the fidelity optimizer may change the fidelity level of a simulated node (e.g., of a larger group of nodes) associated with one or more node states. The fidelity optimizer may change a fidelity level in response to a detected state change. The fidelity optimizer may detect a set of states or conditions corresponding to a previously observed pattern, and dynamically change the fidelity level in anticipation of a state change.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:
1. A simulation environment, comprising:
at least one simulator configured to generate a simulation model, the simulator including one or more processors, the simulation model comprising a plurality of cycles, the simulation model associated with one or more initial conditions, a plurality of states, and at least one fidelity level, the plurality of cycles corresponding to a sequence of cycles, each cycle of the sequence of cycles corresponding to a subset of the simulation model as a whole, the sequence of cycles associated with a time window, the sequence of cycles including a first cycle associated with a first time window, the sequence of cycles further including an additional cycle associated with an additional time window, the first time window being different than the additional time window;
at least one fidelity optimizer communicatively coupled to the simulator, the fidelity optimizer configured to:
monitor the plurality of states of the simulation model associated with the first cycle;
change the fidelity level of the additional cycle based on at least one predetermined factor;
dynamically change the fidelity level of the additional cycle based on the monitoring of the plurality of states of the simulation model associated with the first cycle; and
dynamically change the fidelity level based on a model difference associated with the first cycle and the additional cycle.

2. The simulation environment of claim 1, further comprising: at least one model difference sampler communicatively coupled to the fidelity optimizer, the model difference sampler configured to determine the model difference by:
generating at least a first cycle model corresponding to the first cycle and a first fidelity level and a second cycle model corresponding to the additional cycle and a second fidelity level;
and
comparing at least one of a first result of the first cycle model and a second result of the second cycle model.

3. The simulation environment of claim 2, wherein the one or more processors are first processors, and at least one of the fidelity optimizer and the model difference sampler are embodied on one or more second processors.

4. The simulation environment of claim 1, wherein the predetermined factor includes at least one of:
a priority level associated with a level of user interest in the fidelity level of the cycle;
and
a sensitivity level associated with a level of system interest in the fidelity level of the cycle.

5. The simulation environment of claim 1, wherein the fidelity optimizer is configured to dynamically change the fidelity level based on at least one of:
a change of a state of the plurality of states;
and
an anticipated change of the state.

6. The simulation environment of claim 1, further comprising:
at least one memory communicatively coupled to the fidelity optimizer, the memory capable of storing at least one first state pattern associated with a prior change in the fidelity level;
wherein the fidelity optimizer is configured to dynamically change the fidelity level based on the detection of at least one second state pattern, the second state pattern sufficiently similar to the first state pattern.

7. The simulation environment of claim 6, wherein:
the memory is communicatively coupled to the simulator; and
the simulator is configured to modify at least one cycle of the plurality of cycles based on the first state pattern.

8. A method for dynamic control of simulation fidelity, comprising:
executing, via a simulator comprising one or more first processors, at least one simulation model comprising a plurality of cycles, the simulation model associated with a plurality of states and with at least one fidelity level, the plurality of cycles corresponding to a sequence of cycles, each cycle of the sequence of cycles corresponding to a subset of the simulation model as a whole, the sequence of cycles associated with a time window, the sequence of cycles including a first cycle associated with a first time window, the sequence of cycles further including an additional cycle associated with an additional time window, the first time window being different than the additional time window;
changing, via a fidelity optimizer comprising one or more second processors, the at least one fidelity level based on at least one predetermined factor;
monitoring, via the fidelity optimizer, the plurality of states of the simulation model associated; and
dynamically changing, via the fidelity optimizer, the at least one fidelity level based on the monitoring, via the fidelity optimizer, the plurality of state of the simulation model.

9. The method of claim 8, wherein dynamically changing, via the fidelity optimizer, the at least one fidelity level based on the monitoring, via the fidelity optimizer, the plurality of state of the simulation model includes:
dynamically changing, via the fidelity optimizer, the at least one fidelity level from a first fidelity level to a second fidelity level based on at least one model difference between a first result of a first model cycle of the simulation model and at least one second result of a second model cycle associated with the second fidelity level.

10. The method of claim 9, wherein dynamically changing, via the fidelity optimizer, the at least one fidelity level from a first fidelity level to a second fidelity level based on a model difference between a first result of a first model cycle of the simulation model and at least one second result of a second model cycle associated with the second fidelity level includes:
sampling, via a model difference sampler, the first result of the at least one first model cycle, the first model cycle associated with the first fidelity level;
determining, via the model difference sampler, the at least one second result by executing the at least one second model cycle;
determining, via the model difference sampler, the at least one model difference by comparing at least one of the first result and the second result;
and
dynamically changing the at least one fidelity level from the first fidelity level to the second fidelity level based on the at least one determined model difference.

11. The method of claim 8, wherein dynamically changing, via the fidelity optimizer, the at least one fidelity level based on the monitoring includes:
   changing at least one fidelity level in response to a change in at least one state of the plurality of states.

12. The method of claim 8, wherein dynamically changing, via the fidelity optimizer, the at least one fidelity level based on the monitoring includes:
   changing at least one fidelity level in anticipation of a change in at least one state of the plurality of states.

\* \* \* \* \*